(12) United States Patent
Häuslmann

(10) Patent No.: US 10,709,009 B2
(45) Date of Patent: Jul. 7, 2020

(54) ELECTRICAL CIRCUIT AND METHOD FOR PRODUCING AN ELECTRICAL CIRCUIT

(71) Applicant: ZF Friedrichshafen AG, Friedrichshafen (DE)

(72) Inventor: Mathias Häuslmann, Amberg (DE)

(73) Assignee: ZF Friedrichshafen AG, Friedrichshafen (DE)

(*) Notice: Subject to any disclaimer, the term of this patent is extended or adjusted under 35 U.S.C. 154(b) by 281 days.

(21) Appl. No.: 15/527,347

(22) PCT Filed: Oct. 19, 2015

(86) PCT No.: PCT/EP2015/074087
§ 371 (c)(1),
(2) Date: May 17, 2017

(87) PCT Pub. No.: WO2016/078846
PCT Pub. Date: May 26, 2016

(65) Prior Publication Data
US 2017/0332482 A1 Nov. 16, 2017

(30) Foreign Application Priority Data
Nov. 20, 2014 (DE) .................. 10 2014 223 653

(51) Int. Cl.
*H01L 23/00* (2006.01)
*H05K 1/02* (2006.01)
(Continued)

(52) U.S. Cl.
CPC ......... *H05K 1/0216* (2013.01); *G01D 11/245* (2013.01); *G06K 19/07771* (2013.01);
(Continued)

(58) Field of Classification Search
None
See application file for complete search history.

(56) References Cited

U.S. PATENT DOCUMENTS 6,869,019 B1 3/2005 Nagi et al.
2006/0157568 A1 7/2006 Ato et al.
(Continued)

FOREIGN PATENT DOCUMENTS

DE 10 2006 012 600 A1 9/2007
JP H11-238103 A 8/1999

OTHER PUBLICATIONS

International Search Report and Written Opinion of the International Search Authority dated Dec. 18, 2015 in International Application No. PCT/EP2015/074087 (English and German languages) (12 pp.).

*Primary Examiner* — Reema Patel
(74) *Attorney, Agent, or Firm* — Brinks Gilson & Lione

(57) ABSTRACT

One general aspect of the present disclosure includes an electrical circuit with a circuit carrier, at least one electrical component arranged on the circuit carrier, and at least one data transmission device with an antenna section. The data transmission device may be configured for wireless transmission of data and may include a housing, where the at least one electrical component, the at least one data transmission device, and at least one section of the circuit carrier are at least partially enclosed by the housing. At least the antenna section of the data transmission device may be arranged in a transmission range inside the housing and the transmission range may be spaced at a distance from the circuit carrier.

16 Claims, 3 Drawing Sheets

(51) Int. Cl.
    *H01L 23/66*      (2006.01)
    *H05K 3/28*       (2006.01)
    *G01D 11/24*      (2006.01)
    *G06K 19/077*     (2006.01)
    *H01L 23/552*     (2006.01)

(52) U.S. Cl.
    CPC ............ *H01L 23/552* (2013.01); *H01L 23/66* (2013.01); *H05K 1/0243* (2013.01); *H05K 3/284* (2013.01); *H01L 2223/6611* (2013.01); *H01L 2223/6677* (2013.01); *H01L 2924/15153* (2013.01); *H01L 2924/16195* (2013.01); *H01L 2924/3025* (2013.01); *H05K 2201/10098* (2013.01); *H05K 2201/10371* (2013.01); *H05K 2203/1316* (2013.01)

(56) References Cited

U.S. PATENT DOCUMENTS

| | | | |
|---|---|---|---|
| 2010/0140757 A1 | 6/2010 | Kang | |
| 2011/0096505 A1 | 4/2011 | Inoue | |
| 2014/0028518 A1* | 1/2014 | Arnold | H01Q 1/526 343/841 |
| 2014/0293529 A1* | 10/2014 | Nair | H01Q 1/2291 361/679.31 |

* cited by examiner

ELECTRICAL CIRCUIT AND METHOD FOR PRODUCING AN ELECTRICAL CIRCUIT

CROSS REFERENCE TO RELATED APPLICATIONS

This application is a filing under 35 U.S.C. § 371 of International Patent Application PCT/EP2015/074087, filed Oct. 19, 2015, and claims the priority of German Patent Application 10 2014 223 653.3, filed Nov. 20, 2014.

TECHNICAL FIELD

The present disclosure pertains to an electrical circuit and a method for producing an electrical circuit, particularly for electronic devices able to transfer data wirelessly, such as control devices, sensors, and the like.

BACKGROUND

Electronic control devices can, for instance, be exposed to mechanical, physical, and chemical stresses and can thus be protected by housing. Particularly for the calibration, diagnosis, and the like, such control devices can also comprise contacting possibilities, such as plug connections, for example. A diagnostic device can be plugged into such a contact point; it is then possible, for example, to calibrate a control device.

DE 10 2006 012 600 A1 discloses an electronic component, an electronic assembly, and a method to produce an electronic assembly.

With that in mind, the present disclosure teaches an improved electrical circuit and an improved method to produce an electrical circuit in accordance with the independent claims. Advantageous designs follow from the dependent claims and the following description.

BRIEF SUMMARY

According to embodiments of the present disclosure, an electrical circuit can be provided, particularly one that has an interface for the wireless data transmission arranged in a housing sealed off from an environment. The interface for the wireless data transmission can be shielded from electrical components of the circuit with respect to electromagnetic radiation. A contactless calibration, diagnosis, and the like of an electrical circuit or a control device via a radio interface or a wireless interface and an advantageous arrangement of a wireless communication device in an electrical circuit with regard to electromagnetic compatibility can thus be enabled. In particular, the interface for the wireless data transmission can be designed as a radio chip, which is advantageously arranged inside the housing of the electrical circuit with respect to the electromagnetic compatibility and can be controlled by means of an activation pattern, for example.

According to embodiments of the present disclosure, a favorable positioning of the transmission device can advantageously be performed for the minimal electromagnetic stress of other components as well as for the improved send properties or communication through a housing part or an intermediate medium, such as a casting compound that is as thin as possible. A favorable reduction or avoidance of external contact points and thus potential weak sealing points of the electrical circuit can also be achieved. Long cable harnesses or wiring, an expansion or opening of the housing of the electrical circuit to read out or to transmit data, as well as sealing elements and further components can also be omitted due to the sealed wireless data transmission device. Not just a wireless communication can thus be realized EMC-neutral (EMC=electromagnetic compatibility) by means of electrical circuits, but the electrical circuit can easily be identified and verified during a manufacturing process and/or programming process. It is therefore also possible that several electrical circuits such as inside a vehicle, for example a gearbox control, an engine control, actuator, etc. can communicate with each other and can be read out synchronously or in parallel.

A corresponding electrical circuit comprising a circuit carrier, at least one electrical component arranged on the circuit carrier, at least one data transmission device with an antenna section, wherein the data transmission device is designed for the wireless transmission of data, and a housing, wherein the at least one electrical component, the at least one data transmission device and at least one section of the circuit carrier are enclosed by the housing, is characterized in that at least the antenna section of the at least one data transmission device is arranged in a transmission range within the housing, which is spaced at a distance from the circuit carrier.

The electrical circuit can be a control device, a measuring instrument, a sensor, a telematics control unit or the like, for example. In particular, the electrical circuit can be used for a vehicle. The circuit carrier can be a circuit board, a conductor board, or a substrate. The circuit carrier can have two main surfaces. Electrical components can be arranged on one main surface or on both main surfaces. In particular, the electrical circuit can have a majority of components that can be arranged on at least one main surface of the circuit carrier. An electrical component can be a passive electrical component or an active electrical component such as an integrated circuit, a chip, or a power supply unit. The electrical circuit can also comprise more than one circuit carrier. The data transmission device can be designed to transmit data wirelessly between the electrical circuit and an environment of the electrical circuit by means of radio, for example. The data transmission device can be executed like a radio chip or the like, for example. The data transmission device can be executed as a discreet component, wherein the antenna section and the main section can overlap with respect to a layout at least in part. The data transmission device can comprise a circuit section comprising an electrical circuit and the antenna section. Contrary to an integrated design, the antenna and the circuit section can also be arranged spatially separated from each other and be connected to each other through electrical lines. The housing can be designed to seal the electrical circuit against an environment and to protect it from mechanical, electrical, chemical, and/or physical stress. The transmission range can be arranged distanced from an external surface inside of the housing. The transmission range can particularly be distanced from the circuit carrier in a normal manner by the above-mentioned distance to a main extension level of the circuit carrier. The electrical circuit can have external electrical connections for the electrical contacting of the electrical circuit from the outside, wherein the external electrical connections are contactable from outside the housing.

According to one embodiment, the distance can correspond to at least one height of the at least one electrical component with regard to a surface of the circuit carrier. The height may correspond to a distance between the surface of the circuit carrier and a surface of the electrical component facing away from the circuit carrier. If several electrical components are arranged on the surface of the circuit carrier, the distance may correspond to at least one height of the highest electrical component, for example. The transmission range can therefore be arranged outside a component range of the electrical circuit. The transmission range may therefore normally have a greater distance with regard to a main extension level of the circuit carrier compared to the at least one electrical component. For example, the transmission range can be arranged between the at least one component and the external surface of the housing. Such an embodiment provides the advantage that an electromagnetic compatibility can be improved with regard to a wireless data transmission. A disturbance of components through the wireless data transmission or also a disturbance of the wireless data transmission through components and the like can thus be minimized or prevented.

The transmission range can also be arranged inside a housing wall of the housing. A wall thickness or a material thickness of the housing wall on a side facing the external surface can be less than on a side facing the at least one electrical component. Such an embodiment provides the advantage that the transmission properties of the at least one data transmission device can be improved based on less housing material that has to be penetrated by radio waves.

According to one embodiment, the housing can have a housing wall that encloses an air-filled cavity, for example, that the at least one component is arranged in. According to one more embodiment, the housing can be constructed massively so that the housing wall can extend to a surface of the at least one component.

In particular, the at least one data transmission device can be arranged in the transmission range with the antenna section. The at least one data transmission device can be connected to the at least one electrical component and additionally or alternately be connected to the circuit carrier electrically conductive by means of electrical connecting elements. Such an embodiment provides the advantage that more space can be saved on the circuit carrier so that the electrical circuit can be designed in a more compact manner, for example. A radio chip can also be used as a data transmission device, for example.

The electrical circuit may further comprise a shielding element for the electromagnetic shielding of the antenna section and the at least one electrical component from each other. The shielding element can be attached to the circuit carrier spanning the at least one electrical component. The transmission range can be arranged on a surface of the shielding element facing away from the circuit carrier. The shielding element can be arranged extending on the circuit carrier across a main surface of the circuit carrier at least in part. Such an embodiment provides the advantage that an electromagnetic compatibility of the data transmission device or the antenna section or the wireless data transmission can be improved with respect to the at least one electrical component.

At least the antenna section of the at least one data transmission device can be arranged on a surface facing away from the circuit carrier of the at least one shielding element. Advantageously, the data transmission device or just the antenna section of the data transmission device can be attached to the shielding element.

According to one embodiment, the shielding element can be coupled thermally with the at least one electric component and additionally or alternatively with the circuit carrier. Such an embodiment provides the advantage that the shielding element can be used as a heat dissipation device or a heat sink of the electrical circuit. Heat dissipation from electrical components can thus be improved and the electromagnetic compatibility can additionally be improved inside the electrical circuit.

An additional housing can also be provided, in which at least the antenna section or at least one data transmission device is enclosed. The at least one data transmission device can be arranged in the transmission range. Such an embodiment offers the advantage that the at least one data transmission device or at least its antenna section can be protected from stress caused by a material of the housing.

For example, the housing can be formed at least partially from a casting compound and additionally or alternatively from a plastic material. Additionally or alternatively, the housing can be assembled at least partially from at least one plastic element. The transmission range can be arranged in the at least one plastic element. The housing can therefore be realized by means of a casting compound or plastic, or rather plastic parts or as a mixed form of plastic or rather plastic parts and a casting compound. In case a casting compound is used for the housing, the circuit carrier can be surrounded by the casting compound, wherein the at least one electric component is protected by a so-called molded housing. The casting compound can be an epoxy res-in such as a thermoset, etc. If the housing is formed from plastic, the housing can have a housing base and a lid. The lid and the housing base can be or can get screwed together, welded, etc. At least one housing part of the housing can also be shaped from a metal. Such an embodiment offers the advantage that sensitive electric or electronic components can be protected from harmful outer influences, particularly from mechanical, physical and/or chemical stresses such as vibrations, temperature differences, moisture, or attack of fluid media such as oils, for example.

The at least one data transmission device can also be designed to receive an activation signal and to bring about or start an activation process of the electrical circuit such as while responding to a definable signal path of the activation signal. An activating or responding of the at least one data transmission signal or a radio chip can be effected by definable or predefined control patterns or signal paths. Such control patterns can activate the at least one data transmission device for it to become active. Such an activation can be done by means of RFID (Radio Frequency Identification=Identification by means of electromagnetic waves). Such an embodiment offers the advantage that the electrical circuit can be operated particularly energy-saving as activation can be realized as required. Moreover, an energy supply of the electrical circuit can also be induced through the at least one data transmission device and an energy coupling signal.

A method for producing an electrical circuit comprises the following steps:

Providing a circuit carrier on which at least one electrical component is arranged, and at least one data transmission device with an antenna section wherein the data transmission device is designed for the wireless transmitting of data; and Enclosing the at least one electrical component, the at least one data transmission device, and at least one partial section of the circuit carrier in a housing, wherein at least the antenna section of the at least one data transmission device is arranged in a transmission area of the electrical circuit within the housing, which is spaced at a distance from the circuit carrier.

By performing the method, it is possible to produce an embodiment of the previously listed electrical circuit. The step of the enclosing may comprise a partial step of the arranging at least of the antenna section of the at least one data transmission device in the transmission range of the electrical circuit within the housing.

According to embodiments of the present disclosure, a wireless calibration, a wireless diagnosis, troubleshooting or debugging, and additionally or alternatively a wireless flashing of the electrical circuit or the control device are thus made possible, for example. Even if the electrical circuit of the housing is arranged protected, the electrical circuit must be able to be calibrated or diagnosed and flashed. The calibrating of electrical circuits or control devices can be understood as an iterative process of measuring and adjusting during the runtime to optimally adjust the parameters of algorithms or control device algorithms. To achieve an optimized controller function in the electrical circuit, changes of numerous parameter values may be required. They may be scalar quantities and additionally or alternatively characteristic curves and characteristic diagrams. It can be the objective of the so-called flashing to update an application in a flash memory of the electric circuit. This may particularly be useful and necessary during a development phase, but also in case of already installed electrical circuits or control devices. Output parameters of diagnosis functions can be acquired the same as measurement signals and can be shown above the time in display windows. Input parameters of diagnosis functions can be inserted and changed in adjustable windows the same as calibration parameters. In case of parameter changes, a diagnosis function can be performed in the electrical circuit. In order to carry out a calibration of the electrical circuit, a contact point for the data transmission shall be media-tight towards a medium in the surroundings of the electrical circuit. According to embodiments of the present disclosure, it can be achieved, in particular, that with electrical circuits overmolded with a casting compound, but also conventional housings such as those made of plastic, no specific devices for the impermeability are required. Errors during sealing can thus be avoided, and it can be prevented that a sealing unit becomes brittle and possibly breaks down, which could otherwise result in a confirmation of the electrical circuit. One can furthermore save on an assembly space that a mechanical contact point would require for data transmission. With an over-molded housing, or a housing made of a casting compound, one can furthermore also forego a special tool that would be used to realize a recess or opening/contact point otherwise. But work steps can also be eliminated with a lid/base housing in order to realize a mechanical contact point for an electrical circuit or a control device. According to some embodiments of the present disclosure, one can prevent, if a readout of several components is required, having to elaborately connect these with a mechanical contact point for the data transmission using long wiring harnesses or having to mount several contact points or openings. In particular, having to remove the electrical circuit for the data transmission or for reading out data from the installation site, such as from a vehicle engine compartment, for example, can thus be avoided. This can be achieved by means of wireless data transmission into and out of the electrical circuit or a suitable radio technology. Some examples for such a radio technology are WLAN, Bluetooth, ZigBee, NFC, etc. A data transmission device can be designed as a radio chip, which is at least compatible with WLAN, Bluetooth, and ZigBee. A simultaneous processing of several such radio technologies can also be achieved by means of the data transmission device. By means of a so-called multi-wireless chip, gateway devices can be realized and network technologies can be combined in a simple and inexpensive manner. Optimized chips can also be used for the data transmission device in terms of temperature, size, performance, etc. Data or values can be read out, calibrated, etc. with a compatible reader. Electrical components can be connected on the circuit carrier with the at least one data transmission device, such as also a control device for telematics services (Telematic Control Unit=TCU). A digital input represented by the data transmission device, such as a control device for telematics services can thus be switched to calibration mode or parameterization mode, for example. A production robot can therefore always check a current status of a software version that should be downloaded onto the control device, if necessary, can constantly document, which step of a production chain the control device is currently in, what the percentage is of an installation that has already been concluded, a validation test can be performed, a bootloader can be controlled, etc., and all that without a necessity of a fixed cabling of the control device or the electrical circuit, but wireless or contactless continually during a production phase.

BRIEF DESCRIPTION OF THE DRAWINGS

Embodiments of the present disclosure are further explained with reference to the enclosed drawings. The following is shown.

DETAILED DESCRIPTION

In the following description of preferred embodiments of the present disclosure, the same or similar reference symbols are used for the elements represented in the different figures, which seem similar, wherein a repeated description of these elements is omitted.

Figure 1:
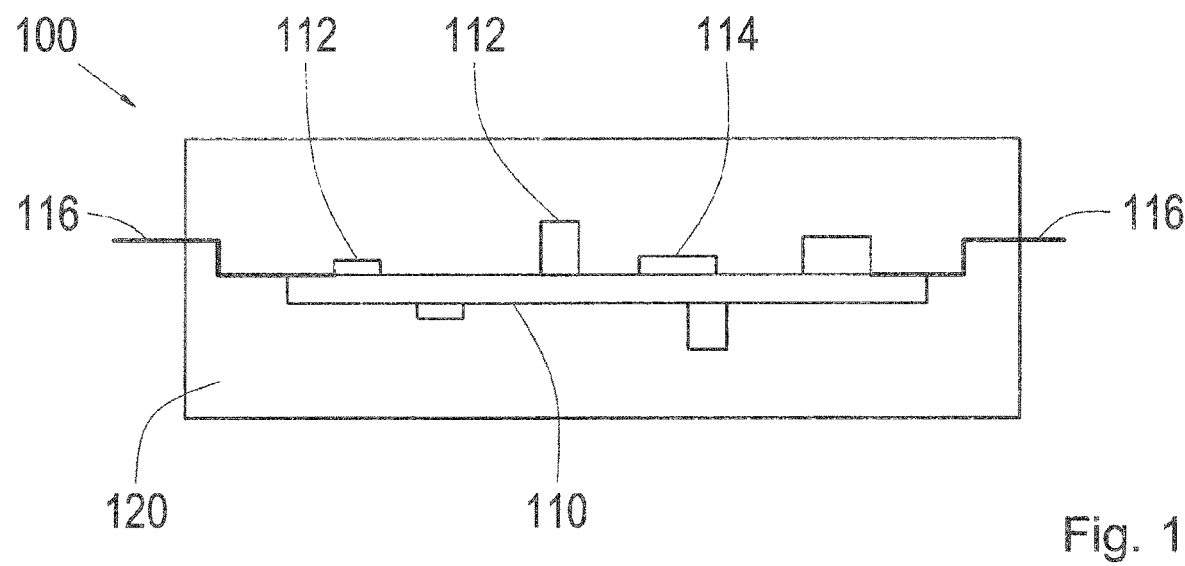
FIG. 1 shows a schematic cross-section of an electrical circuit.

FIG. 1 shows a schematic cross-section of a control device 100. The control device 100 has a circuit board 110 that a multitude of electronic components 112 is arranged on. The electronic components 112 are placed on both main surfaces of the circuit board 110. A radio chip 114 is furthermore mounted on the circuit board 110. An electrical contacting of the circuit board 110 is realized through connections 116. The control device 100 further comprises a casting compound 120 or a mold compound, which represents a housing of the control device 100 and that the circuit board 110, the electronic components 112, the radio chip 114, and partial sections of the connections 116 are molded into.

Figure 2:
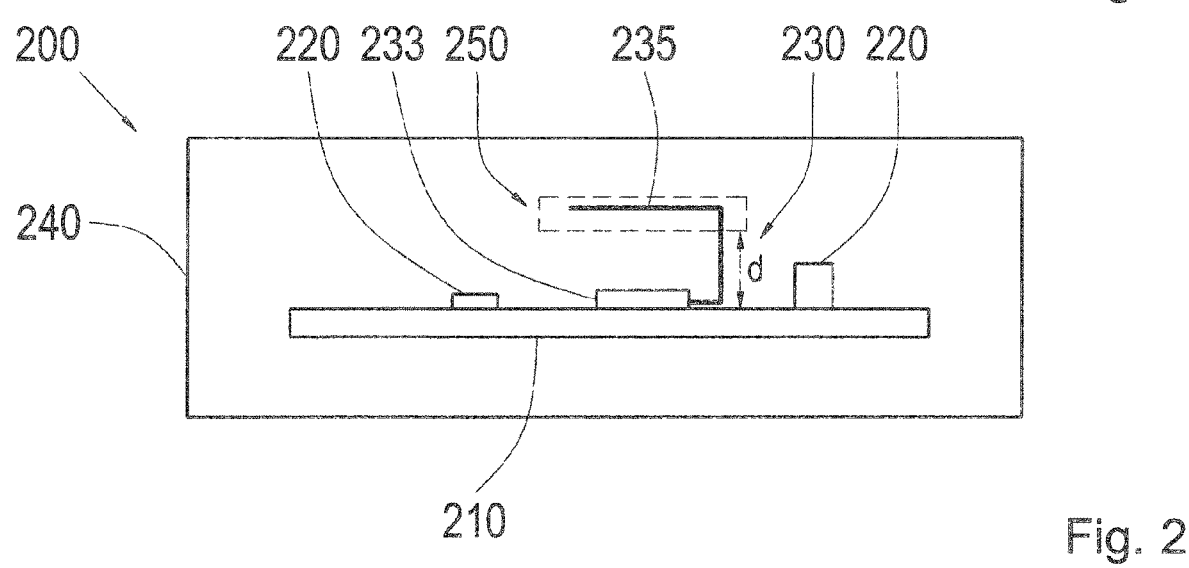
FIGS. 2 to 6 shows schematic cross-sections of electrical circuits according to embodiments of the present disclosure.

FIG. 2 shows a schematic cross-section of an electrical circuit 200 according to an embodiment of the present disclosure. The electric circuit 200, in particular, is a control device, or the like, to be used in a vehicle or at a different point of use, for example. The electrical circuit 200 is designed capable to transmit data contactless or wireless.

The electrical circuit 220 has a circuit carrier 210 or a circuit board. In other words, the circuit carrier 210 is a circuit board or a printed circuit. The circuit carrier 210 comprises two main surfaces facing away from each other.

Two electronical or electrical components 220 are arranged on the circuit carrier 210 by way of example in accordance with the embodiment of the present disclosure represented in FIG. 2. The components 220 are fitted on a first main surface of the two main surfaces of the circuit carrier 210. Alternatively, just one electrical component 220, or more than two electrical components 220, particularly a multitude of electrical components 220, can be arranged on the circuit carrier 210. The circuit carrier 210 can also be fitted with electrical components on both main surfaces.

The electrical circuit 200 furthermore comprises a data transmission device 230 with a circuit section 233 and an antenna section 235. The data transmission device 230 is designed to transmit data wirelessly between the electrical circuit 200 and an environment of the electrical circuit 200.

The electrical circuit 200 furthermore has a housing 240. The housing 240 is designed to enclose the electrical circuit 200 at least in part. According to the embodiment of the present disclosure shown in FIG. 2, the housing is formed from a casting or mold compound. In other words, a casting compound represents the housing 240 of the electrical circuit 200. The circuit carrier, the electrical components 220, and the data transmission device 230 are arranged or molded in or are encased with the circuit section 233 and the antenna section 235 in the housing 240. According to another embodiment, the housing 240 is formed from a plastic material and additionally or alternatively from a metal material or is at least assembled from a plastic section and/or at least a metal section.

The electrical circuit 200 comprises a transmission range 250. The transmission range 250 is arranged inside of the housing 240). The transmission range 250 is spaced at a definable distance d from the circuit carrier 210. The antenna section 235 of the data transmission device 230 is arranged in the transmission range 250 in accordance with the embodiment of the present disclosure shown in FIG. 2. The transmission range 250 is completely arranged inside of a space enclosed by an external surface of the housing 240. A side of the antenna section 235 facing the circuit carrier 210 and/or of the data transmission device 230 is spaced spatially from a side of the circuit carrier 210 facing the antenna section 235 by means of the distance d. For instance, there can be a gap, such as an air gap between the antenna section 235 and the circuit carrier 210 or between the data transmission device 230 and the circuit carrier 210, whose height can be defined by the distance d.

According to this embodiment, the antenna section 235 is connected to the circuit section 233, which comprises an electrical circuit to control the antenna section 235, for instance, by means of at least one connecting line. In contrast to the antenna section 235 arranged in the transmission range 250, the circuit section 233 is only fitted on the first main surface of the circuit carrier 210 in an exemplary manner.

Alternatively, the circuit section 233 can also be arranged in the transmission range 250. This is useful, for example, when the data transmission device 230 is designed like a radio chip, in which the circuit section 233 and the antenna section 235 are integrated.

In deviation from the representation in FIG. 2, the electrical circuit 200 can also have more than one data transmission device 230. In this case, at least the antenna sections 235 can be arranged in the transmission range 250 or in different transmission ranges. The different transmission ranges can be distanced by a main surface of the circuit carrier 210 each.

One can furthermore see that according to the embodiment of the present disclosure defined in FIG. 2, the distance d is greater between the transmission range 250 and the circuit carrier 210 than a maximum height of the components 220 with respect to the first main surface of the circuit carrier 210. According to another embodiment, the distance d can at least correspond to a height of a highest component 220. According to the embodiment of the present disclosure shown in FIG. 2, the transmission range 250 is also arranged closer to an external surface of the housing 240 than the electrical components 220.

The data transmission device 230 is optionally designed to receive an activation signal from outside the electrical circuit 200. Furthermore, the data transmission device 230 is designed to effect or to initiate an activation process of the electrical circuit 200 responding to a predefined signal path of the activation signal. According to one embodiment, the electrical circuit 200 is designed to be supplied with energy wirelessly. Alternatively, the electrical circuit 200 can have electrical connections to supply the electrical circuit 200 with energy.

Figure 3:
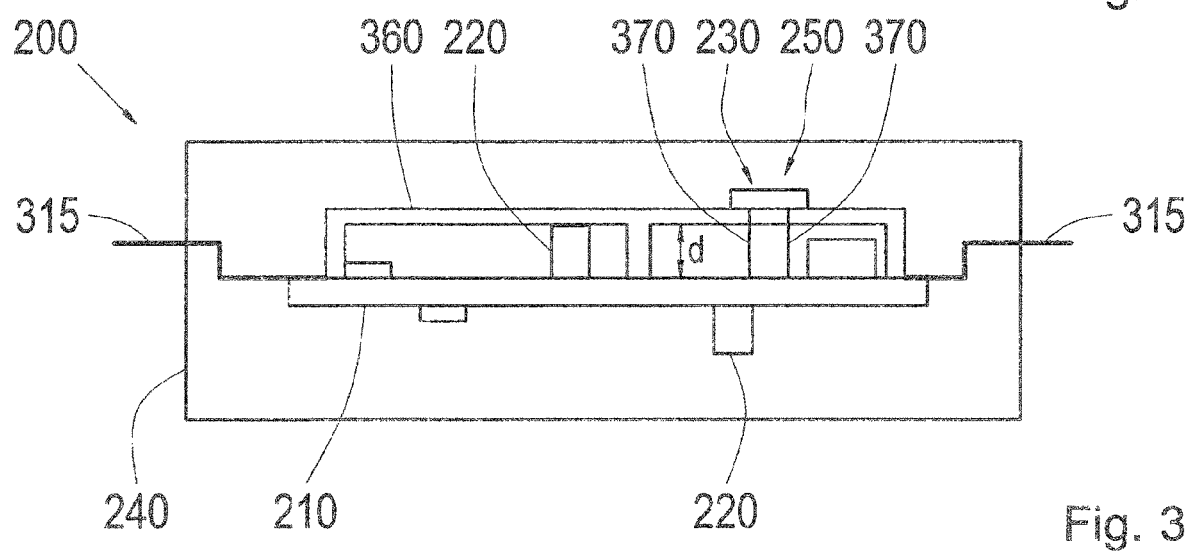

FIG. 3 shows a schematic cross-section of an electrical circuit 200 according to an embodiment of the present disclosure. The electrical circuit 200 in FIG. 3 is similar to the electrical circuit from FIG. 2, or rather corresponds to the electrical circuit from FIG. 2 with the exception that the electrical circuit 200 in FIG. 3 has a greater number of electrical components 220, such as five merely by way of example; that the circuit carrier 210 is fitted with the electrical components 220 on both sides, the data transmission device 230 is designed as a radio chip, wherein the antenna section and the circuit section are arranged in the transmission range, and that the electrical circuit 200, by way of example, furthermore has two electrical connections 315, a shielding element 360 or a shade element and electrical connection means 370 for contacting the data transmission device 230 or the radio chip.

The electrical connections 315 extend from the circuit carrier 210 out of the housing 240. The electrical connections 315 are intended for the electrical contacting of the electrical circuit 200.

According to the embodiment of the present disclosure shown in FIG. 3, the data transmission device 230 is arranged in the transmission range 250. The data transmission device 230 is therefore spaced at a distance d from the circuit carrier 210. The antenna section of the data transmission device 230 is designed integrated with a circuit section of the data transmission device 230.

According to the embodiment of the present disclosure shown in FIG. 3, the electrical circuit has a shielding element 360. Optionally, the electrical circuit 200 may also comprise a multitude of shielding elements 360. The shielding element 360 is designed to electromagnetically shield the data transmission device 230 from the electrical components 220. The shielding element 360 is arranged on the first main surface of the circuit carrier 210. In particular, the shielding element 360 is attached to three contact points on the circuit carrier 210 merely by way of example. According to the embodiment of the present disclosure shown in FIG. 3, the shielding element 360 has an E-shaped cutting profile. By means of this cutting profile, the shielding element 360 is supported centrally towards the circuit carrier 210. A partition wall can furthermore be formed, making it possible to shape two areas shielded from each other, in which electrical components 220 can be arranged each.

More specifically, the shielding element 360 is arranged on the circuit carrier spanning the electrical components 220 on the first main surface of the circuit carrier 210.

The transmission range 250 is arranged on a surface facing away from the circuit carrier 210 or rather on a side of the shielding element 360. The data transmission device 230 is therefore arranged on the surface facing away from the circuit carrier 210 or rather on the side of the shielding element 360. A position of the data transmission device 230 thus corresponds to a position of the transmission range 250. The data transmission device 230 is connected to the circuit carrier 210 electrically conductive via the electrical connection means 370. The electrical connection means 370 hereby extend from the data transmission device 230 through the shielding element 360 to the circuit carrier 210.

According to one embodiment, the shielding element 360 is thermally coupled with at least one electrical component 220 and additionally or alternatively with the circuit carrier 210. The shielding element 360 can be in direct contact with a surface of the electrical component 220, for example, or can be connected to the electrical component 220 through a material with good thermal conductivity. The shielding element 360 thus functions as a heat sink or a heat dissipation device in the electrical circuit 200.

The electrical circuit 200 or the control device is thus molded with a casting compound, for example, which represents the housing 240. The casting compound can be a conventional epoxy resin such as thermoplastic or thermoset, for example. The electrical contacts 315 or contact points are designed media-tight with respect to a medium in an environment of the electrical circuit 200. Oil or another medium can thus not creep across the, for example, electrical contacts 315 to the circuit carrier 210. For example, it is also possible to use a two-component overmold. The electronic or electric components 220 and the shielding element 360 with the data transmission device 230 are placed on the circuit carrier 210 and are then overmolded or cast with the casting compound or a material of the housing 240. The casting compound represents or rather forms the housing 240.

The shielding element 360 or a shielding means enables an approach of the data transmission device 230 to an external surface of the casting compound and thus of the housing 240. The shielding element 360 is designed as a metal plate, for example, or is formed from metal. It is possible that the data transmission device 20 is connected electrically conductive with the circuit carrier 210 by means of the connection means 370 through drill holes in the shielding element 360. The shielding element 360 is designed to prevent disturbances of the electrical components 220 on the circuit carrier 210, which can be caused when controlling the data transmission device 230. The shielding element 360 can be mechanically connected or is connected to the circuit carrier 210 by means of a plug connection, screw connection, snap connection, or the like.

One height of the shielding element 360 above the circuit carrier 210 is adaptable to a height of the components 220 or in relation to an optimal radio connection of the data transmission device 230. There may be a reduced thickness of the housing 240 between the transmission range 250 and an external surface of the casting compound. Using the shielding element 360, an electromagnetic compatibility can be improved within the electric circuit 200. This prevents that the antenna section of the data transmission device 230, which is radiation-intensive, must be shielded to a large extent. Due to the reduced housing thickness in the transmission range, a transmission property of the data transmission device 230 can also be improved, as too great of a thickness of the circuit carrier 210 could shield or at least weaken radio waves in the transmission range 250.

The shielding element 360 optionally functions as a cooling plate for the heat dissipation of electrical components 220. According to one embodiment, the data transmission device 230 may be enclosed by an additional housing for protection against a casting process. Additionally or alternatively, the electrical circuit 200 can also have a multitude of shielding elements 360, wherein a data transmission device 230 can be arranged on each shielding element and/or at least one shielding element 360 can be arranged on each main surface of the circuit carrier 210.

Figure 4:
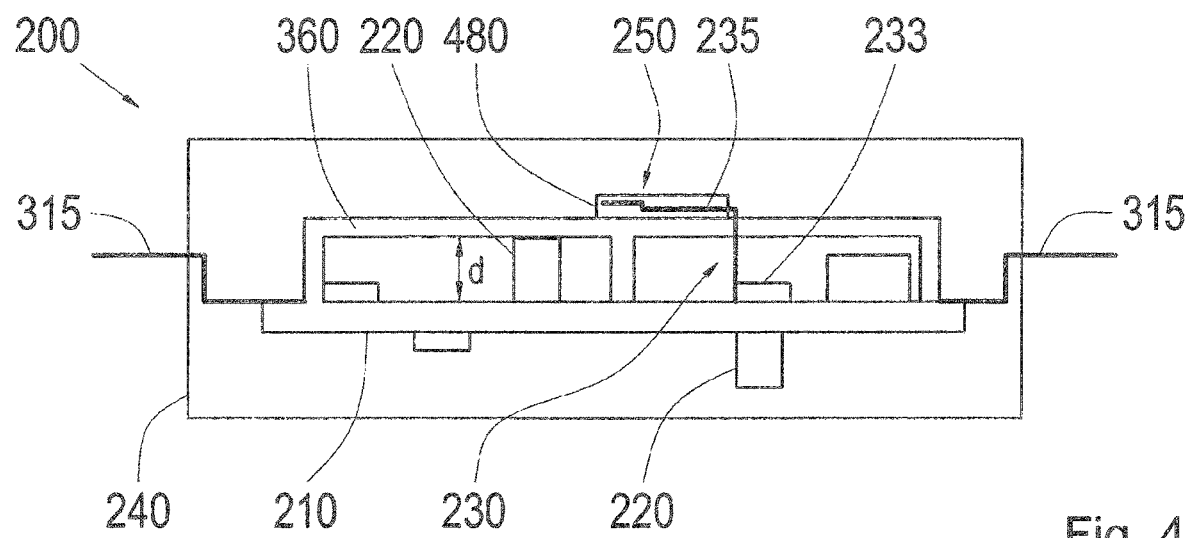

FIG. 4 shows a schematic cross-section of an electrical circuit 200 according to an embodiment of the present disclosure. The electrical circuit 200 in FIG. 4 corresponds to the electrical circuit from FIG. 3 with the exception that the circuit section 233 of the data transmission device 230 is arranged on the first main surface of the circuit carrier 210, the antenna section 235 of the data transmission device 230 is arranged in the transmission range 250 on the side of the shielding element 360 facing away from the circuit carrier 210, and the antenna section 235 is enclosed in an additional housing.

Figure 5:
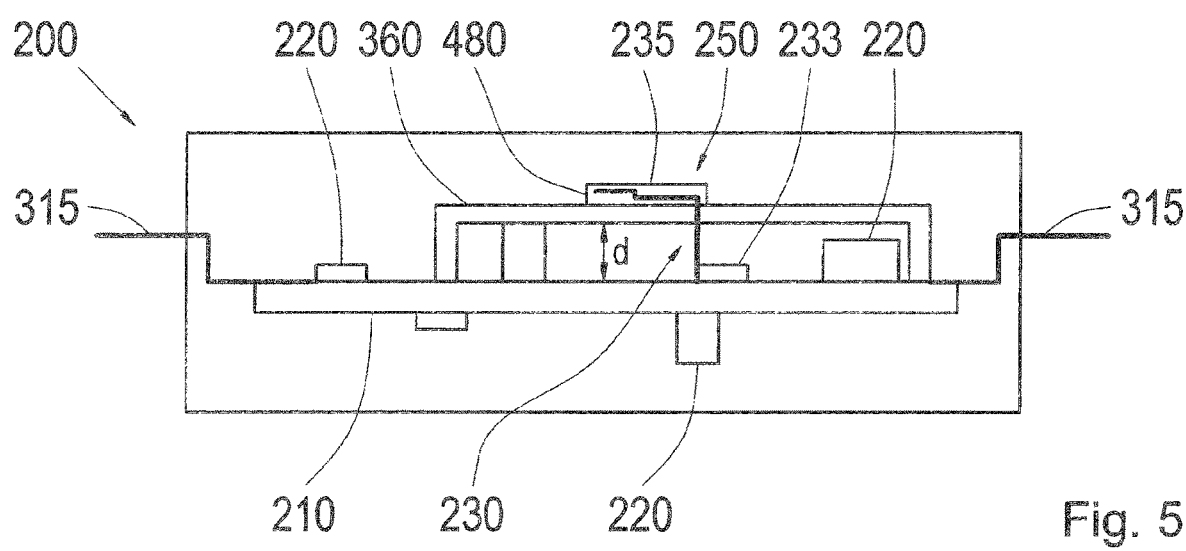

FIG. 5 shows a schematic cross-section with an electrical circuit 200 according to an embodiment of the present disclosure. The electrical circuit 200 in FIG. 5 corresponds to the electrical circuit from FIG. 4 with the exception that the shielding element 360 merely extends across a partial section of the first main surface of the circuit carrier 210. This partial section is smaller than a section of the extension, across which the shielding element 360 from FIG. 4 extends over the first main surface of the circuit carrier 210. According to the embodiment of the present disclosure shown in FIG. 5, the shielding element 360 therefore extends across a main surface of the circuit carrier 210 at least in part, wherein merely a partial quantity of the electrical components 220 is spanned by the shielding element 360.

When referring to FIG. 4 and FIG. 5, it must be noted that the electrical circuit 200 has a data transmission device 230 with a long antenna, wherein the antenna section 235 is arranged in the transmission range and the circuit section 233 or rather a chip section of the data transmission device 230 is arranged on the circuit carrier 210.

Figure 6:
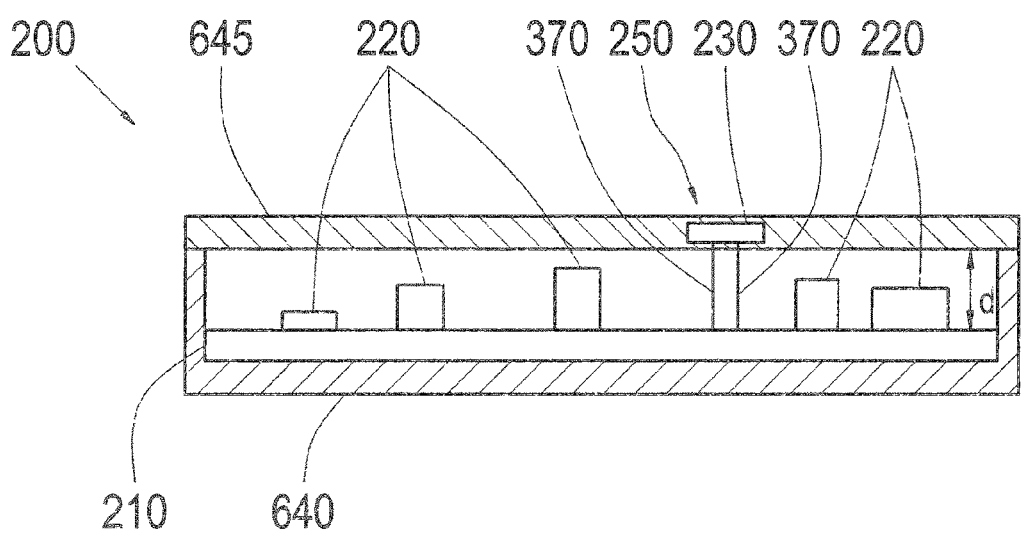

FIG. 6 shows a schematic sectional view of an electrical circuit 200 according to an embodiment of the present disclosure. The electrical circuit 200 in FIG. 6 is similar to the electrical circuit from FIG. 2 or rather corresponds to the electrical circuit from FIG. 2 with the exception that the housing is assembled from a housing shell 640 and a housing lid 645, wherein the data transmission device 230 designed as a radio chip with an integrated circuit section and antenna section is arranged in the transmission range 250, which in turn is arranged in the housing lid 645, and which is connected electrically conductive with the circuit carrier 210 using the electrical connection means 370.

According to the embodiment of the present disclosure shown in FIG. 6, the housing shell 640 is molded from a metallic material and the housing lid 645 is molded from a plastic material. Both the housing shell 640 and the housing lid 645 thus represent the housing of the electrical circuit 200. The circuit carrier 210 is arranged inside the housing shell 640 and the housing lid 645 in an assembled state of the same. The circuit carrier 210 is equipped with an exemplary five electrical components 220 on the first main surface of the same. The housing lid 645 spans the first main surface of the circuit carrier 210 and therefore of the electrical circuit 200. The data transmission device 230 is arranged integrated in the housing lid 645. The data transmission device 230 is connected electrically conductive with the circuit carrier 210 using the electrical connection means 370. The electrical connection means 370 extend from the data transmission device 230 through a wall section of the housing lid 645 facing the circuit carrier 210, out of the same, through a gap between the housing lid 645 and the circuit carrier 210 and to the contact points of the circuit carrier 210.

In other words, the electrical circuit 200 has a plastic lid and a metallic bottom or a metallic shell as its housing. A housing with a plastic lid and plastic bottom part or a plastic shell would also be conceivable. The data transmission device 230 with contact means 370 attached to the same or with contact pins is injected in the plastic lid or the housing lid 645. When installing or fitting the housing lid 645 to the housing shell 640, the contact means 370 of the data transmission device 230 are pressed into intended openings or contact openings of the circuit carrier 210, for example, and an electrically conductive connection is thus established.

Even if it is not shown in FIG. 6, according to a different embodiment, the circuit board 110 can be fitted with components 220 on both sides, for example. According to one embodiment, an interior of the housing represented by the housing shell 640 and the housing lid 645 can be filled in with casting compound or mold compound at least in part. Additionally or alternatively, merely the antenna section of the data transmission device 230 can optionally also be arranged in the transmission range 250 in the housing lid 645, wherein the circuit section of the data transmission device 230 can be arranged on the circuit carrier.

Figure 7:
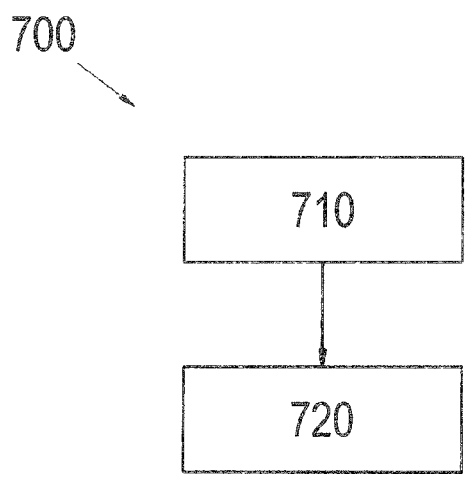
FIG. 7 shows a flow chart of a method according to an embodiment of the present disclosure.

FIG. 7 shows a flow chart of a method 700 according to an embodiment of the present disclosure. The method 700 is a method for producing an electrical circuit. By carrying out the method 700, an electrical circuit can be produced the same as one of the electrical circuits from one of the FIGS. 2 to 6.

The method 700 comprises a step 710 for providing a circuit carrier that at least one electrical component is arranged on and at least one data transmission device with an antenna section. The data transmission device is designed for the wireless transmission of data.

In a step 720 for enclosing to be performed subsequently with respect to the step 710 for provisioning, the at least one electric or electronic component, the at least one data transmission device, and at least one section of the circuit carrier are enclosed in a housing. The step 720 for enclosing is executed such that at least the antenna section of the at least one data transmission device is arranged in a transmission range of the electrical circuit within the housing, which is spaced at a definable distance from the circuit carrier.

The embodiments described and shown in the figures are only chosen by way of example. Different embodiments may be combined with each other completely or in terms of individual features. An embodiment may also be supplemented with features from another embodiment.

If an embodiment comprises an "and/or" combination between a first feature and a second feature, this can be interpreted as the design example according to an embodiment having both the first feature and the second feature, and according to another embodiment only having the first feature or only the second feature.

REFERENCE SIGNS

100 Control device
110 Circuit board
112 Electronic component
114 Radio chip
116 Connection
120 Casting compound
200 Electrical circuit
210 Circuit carrier
220 Electrical component
230 Data transmission device
233 Circuit section
235 Antenna section
240 Housing
250 Transmission range
d Distance
315 Electrical connection
360 Shielding element
370 Electrical connection means
480 Additional housing
640 Housing shell
645 Housing lid
700 Method for producing an electrical circuit
710 Step for provisioning
720 Step for enclosing

I claim:

1. An electrical circuit comprising:
   a housing formed with a molded material;
   a circuit carrier located at least partially within the molded material forming the housing;
   at least one electrical component arranged on the circuit carrier; and
   at least one data transmission device with an antenna section,
   wherein the data transmission device is configured for wireless transmission of data,
   wherein the at least one electrical component, the at least one data transmission device, and at least one section of the circuit carrier are at least partially enclosed by the housing,
   wherein at least the antenna section of the data transmission device is located in the molded material forming the housing and is arranged in a transmission range inside the housing, and
   wherein the transmission range is spaced at a distance from the circuit carrier,
   wherein the housing is a first housing, the electrical circuit further comprising a second housing, wherein at least the antenna section of the at least one data transmission device is enclosed in the second housing, and wherein the second housing is enclosed in the first housing.

2. The electrical circuit of claim 1, wherein the distance corresponds to at least a height of the at least one electrical component with respect to a surface of the circuit carrier.

3. The electrical circuit of claim 1, wherein the at least one data transmission device with the antenna section is arranged in the transmission range, and wherein the at least one data transmission device is electrically connected with at least one of the at least one electrical component and the circuit carrier.

4. The electrical circuit of claim 1, further comprising a shielding element configured for electromagnetic shielding of the antenna section from the at least one electrical component, wherein the shielding element is attached on the circuit carrier and spans the at least one electrical component.

5. The electrical circuit of claim 4, wherein at least the antenna section of the at least one data transmission device is arranged on a surface of the shielding element and faces away from the circuit carrier.

6. The electrical circuit of claim 4, wherein the shielding element is thermally coupled with at least one of the at least one electrical component and the circuit carrier.

7. The electrical circuit of claim 1, wherein the housing is at least partially molded from at least one of a casting compound and a plastic material.

8. The electrical circuit of claim 1, wherein the at least one data transmission device is configured to receive an activation signal and to initiate an activation process of the electrical circuit in response to the activation signal.

9. A method for producing an electrical circuit, the method comprising the following steps:
- arranging at least one electrical component on a circuit carrier;
- enclosing of the at least one electrical component, at least one data transmission device, and at least one partial section of the circuit carrier in a housing, the housing being formed with a molded material,
- wherein the at least one data transmission device is configured for wireless transmission of data and includes an antenna section,
- wherein at least the antenna section of the at least one data transmission device is located in the molded material forming the housing and is arranged in a transmission range of the electrical circuit within the housing, and
- wherein the transmission range is spaced at a distance from the circuit carrier; and
- arranging at least the antenna section of the at least one data transmission device within a second housing.

10. The method of claim 9, wherein the distance corresponds to at least a height of the at least one electrical component with respect to a surface of the circuit carrier.

11. The method of claim 9, wherein the at least one data transmission device with the antenna section is arranged in the transmission range, and wherein the at least one data transmission device is electrically connected with at least one of the at least one electrical component and the circuit carrier.

12. The method of claim 9, further comprising attaching a shielding element to the circuit carrier such that the shielding element spans the at least one electrical component, wherein the shielding element is configured for electromagnetic shielding of the antenna section from the at least one electrical component.

13. The method of claim 12, wherein at least the antenna section of the at least one data transmission device is arranged on a surface of the shielding element and faces away from the circuit carrier.

14. The method of claim 12, wherein the shielding element is thermally coupled with at least one of the at least one electrical component and the circuit carrier.

15. The method of claim 9, wherein the housing is at least partially molded from at least one of a casting compound and a plastic material.

16. The method of claim 9, wherein the at least one data transmission device is configured to receive an activation signal and to initiate an activation process of the electrical circuit in response to the activation signal.

* * * * *